(12) United States Patent
Marukame et al.

(10) Patent No.: US 11,636,315 B2
(45) Date of Patent: Apr. 25, 2023

(54) SYNAPSE CIRCUIT AND ARITHMETIC DEVICE

(71) Applicant: KABUSHIKI KAISHA TOSHIBA, Minato-ku (JP)

(72) Inventors: Takao Marukame, Chuo (JP); Kumiko Nomura, Shinagawa (JP); Yoshifumi Nishi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 1021 days.

(21) Appl. No.: 16/287,008

(22) Filed: Feb. 27, 2019

(65) Prior Publication Data

US 2020/0034695 A1   Jan. 30, 2020

(30) Foreign Application Priority Data

Jul. 26, 2018   (JP) .............................. JP2018-140290

(51) Int. Cl.
*H03K 3/02* (2006.01)
*H01L 29/00* (2006.01)
*H03K 19/00* (2006.01)
*G06N 3/048* (2023.01)
*G06N 3/08* (2023.01)
(Continued)

(52) U.S. Cl.
CPC ............ *G06N 3/048* (2023.01); *G06N 3/049* (2013.01); *G06N 3/063* (2013.01); *G06N 3/08* (2013.01); *H03K 3/02* (2013.01); *H01L 29/00* (2013.01); *H03K 19/00* (2013.01)

(58) Field of Classification Search
CPC ...... G06N 3/0481; G06N 3/049; G06N 3/063; G06N 3/0635; G06N 3/08; H03K 19/00; H03K 3/02; H01L 29/00
See application file for complete search history.

(56) References Cited

U.S. PATENT DOCUMENTS 5,615,305 A      3/1997  Nunally
8,289,755 B1 *  10/2012  Rahim ................ G11C 11/4125
                                                    365/189.08
(Continued)

FOREIGN PATENT DOCUMENTS

JP    2009-158698   7/2009
JP    2013-534676   9/2013
(Continued)

*Primary Examiner* — Metasebia T Retebo
*Assistant Examiner* — James G Yeaman
(74) *Attorney, Agent, or Firm* — Oblon, McClelland, Maier & Neustadt, L.L.P.

(57) ABSTRACT

According to an embodiment, a synapse circuit includes: a buffer that changes an output signal to a second logical value at a timing when an input signal exceeds a first threshold level, in a case where the output signal has a first logical value in a first mode, and changes the output signal to the second logical value at a timing when the input signal exceeds a reference level lower than the first threshold level, in a case where the output signal has the first logical value in a second mode; an adjusting unit that adjusts the first threshold level depending on a stored coefficient; and a mode switching unit that operates the buffer in the first mode during a period in which an acquired spike is not generated, and operates the buffer in the second mode during a period in which the spike is generated.

6 Claims, 8 Drawing Sheets

(51) Int. Cl.
*G06N 3/049* (2023.01)
*G06N 3/063* (2023.01)

(56) References Cited

U.S. PATENT DOCUMENTS

| | | |
|---|---|---|
| 8,433,665 B2 | 4/2013 | Tang et al. |
| 9,495,634 B2 | 11/2016 | Modha |
| 10,175,947 B1 | 1/2019 | Marukame et al. |
| 2015/0074028 A1 | 3/2015 | Miyashita |
| 2015/0262058 A1 | 9/2015 | Modha |
| 2015/0269483 A1* | 9/2015 | Nishitani et al. ....... G06F 3/038 |
| 2016/0049195 A1* | 2/2016 | Yu ...................... G11C 13/0026 |
| | | 365/63 |
| 2016/0260012 A1* | 9/2016 | Hunzinger ............... G06N 3/08 |
| 2018/0053093 A1 | 2/2018 | Olabiyi et al. |
| 2018/0053102 A1 | 2/2018 | Martinson et al. |
| 2018/0053108 A1 | 2/2018 | Olabiyi et al. |

FOREIGN PATENT DOCUMENTS

| | | |
|---|---|---|
| JP | 2018-028906 | 2/2018 |
| WO | WO 2016/158691 A1 | 10/2016 |

* cited by examiner

SYNAPSE CIRCUIT AND ARITHMETIC DEVICE

CROSS-REFERENCE TO RELATED APPLICATIONS

This application is based upon and claims the benefit of priority from Japanese Patent Application No. 2018-140290, filed on Jul. 26, 2018; the entire contents of which are incorporated herein by reference.

FIELD

Embodiments described herein relate generally to a synapse circuit and an arithmetic device.

BACKGROUND

Techniques using a neural network are known. Techniques for configuring a neural network using hardware have also been researched. The neural network configured using hardware includes a large amount of circuits that transmit signals modeled on synapses. For this reason, in the neural network configured using hardware, it is necessary to simplify the configuration of circuits for implementing synapses.

Also, recently, researches on synapses incorporating spike timing dependent synaptic plasticity (STDP) have been done. In the neural network configured using hardware, circuits for implementing synapses incorporating the STDP are required.

DETAILED DESCRIPTION

According to an embodiment, a synapse circuit includes a buffer, an adjusting unit, and a mode switching unit. The buffer changes an output signal to a second logical value at a timing when an input signal exceeds a first threshold level, in a case where the output signal has a first logical value in a first mode, and changes the output signal to the second logical value at a timing when the input signal exceeds a reference level lower than the first threshold level, in a case where the output signal has the first logical value in a second mode. The adjusting unit stores a coefficient and adjusts the first threshold level depending on the coefficient. The mode switching unit acquires a spike signal indicating that a spike is generated, and operates the buffer in the first mode during a period in which the spike is not generated, and operates the buffer in the second mode during a period in which the spike is generated.

Hereinafter, an arithmetic device 10 according to the embodiment will be described in detail with reference to the drawings. The arithmetic device 10 implements neural computation simulating neurons with a simple configuration. The arithmetic device 10 is incorporated in a neural network implemented by, for example, hardware.

Figure 1:
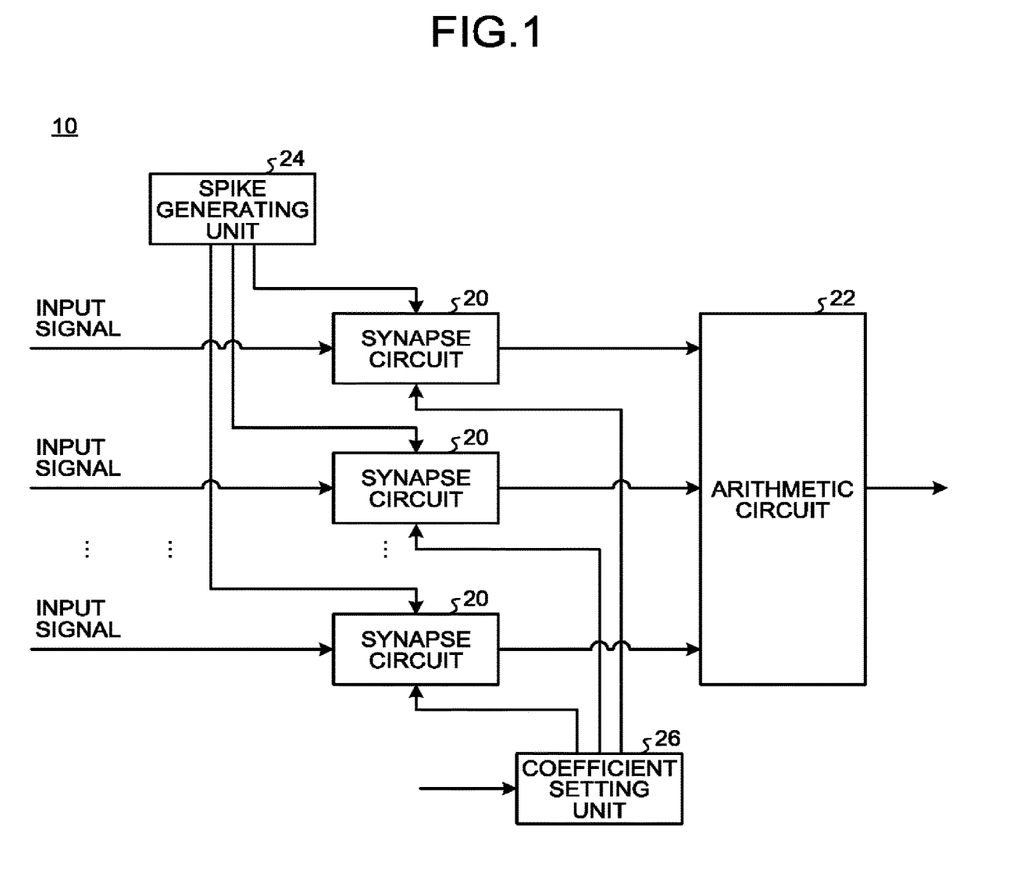
FIG. 1 is a diagram illustrating a configuration of an arithmetic device according to an embodiment.

FIG. 1 is a diagram illustrating a configuration of the arithmetic device 10 according to the embodiment. The arithmetic device 10 includes a plurality of synapse circuits 20, an arithmetic circuit 22, a spike generating unit 24, and a coefficient setting unit 26.

Each of the plurality of synapse circuits 20 acquires, as an input signal, a signal output from another arithmetic device 10 in a preceding stage. Then, the synapse circuit 20 inverts a logical value of an output signal, depending on a level of the acquired input signal.

The synapse circuit 20 switches between a normal mode (the first mode) and a spike mode (the second mode) in response to a spike signal generated from the spike generating unit 24.

In a case where the output signal has the first logical value (for example, a logical L) in the normal mode, the synapse circuit 20 changes the output signal from the first logical value to the second logical value (for example, a logical H) at the timing when the input signal exceeds the first threshold level. Also, in a case where the output signal has the second logical value in the normal mode, the synapse circuit 20 changes the output signal from the second logical value to the first logical value at a timing when the input signal falls below a second threshold level lower than the first threshold level.

In a case where the output signal has the first logical value in the spike mode, the synapse circuit 20 changes the output signal from the first logical value to the second logical value at the timing when the input signal exceeds the reference level lower than the first threshold level. Also, in a case where the output signal has the second logical value in the spike mode, the synapse circuit 20 changes the output signal from the second logical value to the first logical value at a timing when the input signal falls below a reference level higher than the second threshold level.

Also, the synapse circuit 20 internally stores the coefficient. Depending on a magnitude of the stored coefficient, the synapse circuit 20 changes at least one of the first threshold level and the second threshold level. Also, depending on the magnitude of the stored coefficient, the synapse circuit 20 may change the first threshold level, may change the second threshold level, or may change both the first threshold level and the second threshold level.

For example, the synapse circuit 20 makes the first threshold level smaller as the coefficient becomes larger. In this way, in a case where the coefficient is large, the synapse circuit 20 is capable of making a timing of changing the output signal from the first logical value to the second logical value earlier. Also, for example, the synapse circuit 20 makes the second threshold level larger as the coefficient becomes larger. In this way, in a case where the coefficient is large, the synapse circuit 20 is capable of making a timing of changing the output signal from the second logical value to the first logical value earlier.

Also, the synapse circuit 20 acquires a spike signal indicating a timing at which a spike is generated from the spike generating unit 24. The synapse circuit 20 operates in the normal mode during a period in which a spike is not generated. Also, the synapse circuit 20 operates in the spike mode during a period in which a spike is generated.

The arithmetic circuit 22 acquires a plurality of output signals that have been output from the plurality of synapse circuits 20. The arithmetic circuit 22 performs arithmetic processing based on the plurality of acquired output signals. For example, the arithmetic circuit 22 adds logical values of the plurality of output signals and performs a predetermined activation function operation on the added result. Then, the arithmetic circuit 22 outputs a signal representing the result of the activation function operation to a corresponding synapse circuit 20 of the arithmetic device 10 in a subsequent stage.

The spike generating unit 24 applies, to each of the plurality of synapse circuits 20, a spike signal indicating a timing at which a spike is generated. The spike generating unit 24 may receive a spike signal from a device outside the arithmetic device 10 and distribute the spike signal to each of the plurality of synapse circuits 20.

The coefficient setting unit 26 changes the coefficient stored in each of the plurality of synapse circuits 20. For example, the coefficient setting unit 26 changes the coefficient based on an instruction from a learning device or the like outside the arithmetic device 10.

Figure 2:
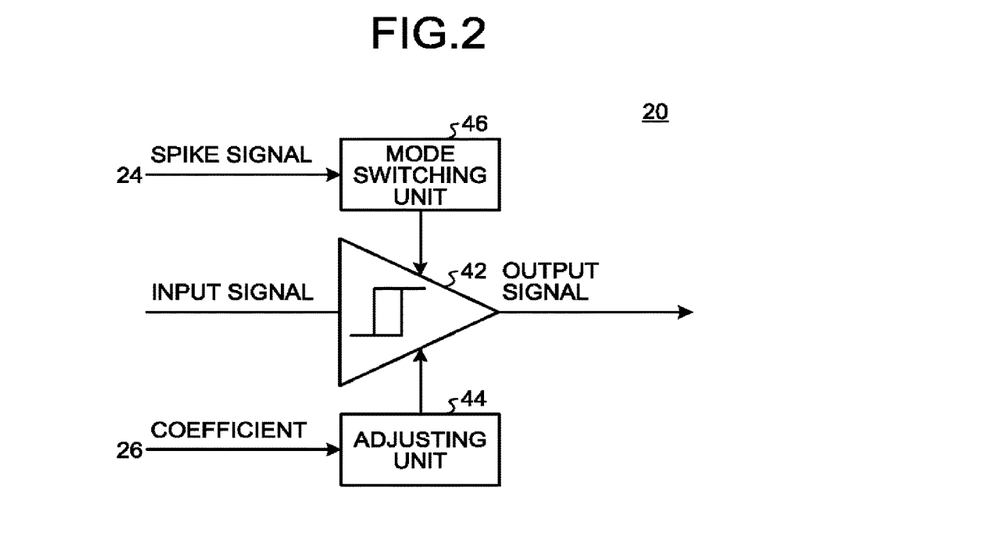
FIG. 2 is a diagram illustrating a configuration of a synapse circuit.

FIG. 2 is a diagram illustrating the configuration of the synapse circuit 20. The synapse circuit 20 includes a hysteresis buffer 42 (an example of the buffer), an adjusting unit 44, and a mode switching unit 46.

The hysteresis buffer 42 receives the input signal and outputs an output signal having a logical value in response to the received input signal. The hysteresis buffer 42 switches an operation between the normal mode and the spike mode.

In a case where the output signal has the first logical value (for example, the logical L) in the normal mode, the hysteresis buffer 42 changes the output signal from the first logical value to the second logical value (for example, the logical H) at the timing when the input signal exceeds the first threshold level. That is, in the normal mode, the hysteresis buffer 42 switches the output signal from the first logical value to the second logical value at the first threshold level as the input signal increases.

Also, in a case where the output signal has the second logical value in the normal mode, the hysteresis buffer 42 changes the output signal from the second logical value to the first logical value at the timing when the input signal falls below the second threshold level lower than the first threshold level. That is, in the normal mode, the hysteresis buffer 42 switches the output signal from the second logical value to the first logical value at the second threshold level as the input signal decreases.

Also, in a case where the output signal has the first logical value in the spike mode, the hysteresis buffer 42 changes the output signal from the first logical value to the second logical value at the timing when the input signal exceeds the reference level. That is, in the spike mode, the hysteresis buffer 42 switches the output signal from the first logical value to the second logical value at the reference level as the input signal increases. The reference level is lower than the first threshold level. Therefore, in the spike mode, the hysteresis buffer 42 is capable of switching the output signal from the first logical value to the second logical value early, as compared with the normal mode.

Also, in a case where the output signal has the second logical value in the spike mode, the hysteresis buffer 42 changes the output signal from the second logical value to the first logical value at the timing when the input signal falls below the reference level. That is, in the spike mode, the hysteresis buffer 42 switches the output signal from the second logical value to the first logical value at the reference level as the input signal decreases. The reference level is higher than the second threshold level. Therefore, in the spike mode, the hysteresis buffer 42 is capable of switching the output signal from the second logical value to the first logical value early, as compared with the normal mode.

The adjusting unit 44 internally stores the coefficient applied from the coefficient setting unit 26. Depending on the magnitude of the stored coefficient, the adjusting unit 44 adjusts at least one of the first threshold level and the second threshold level in the hysteresis buffer 42. Also, depending on the magnitude of the stored coefficient, the adjusting unit 44 may adjust the first threshold level, may adjust the second threshold level, or may adjust both the first threshold level and the second threshold level.

For example, the adjusting unit 44 makes the first threshold level smaller as the coefficient becomes larger. Therefore, the hysteresis buffer 42 makes the timing of changing the output signal from the first logical value to the second logical value earlier, as the coefficient becomes larger. Also, the adjusting unit 44 makes the second threshold level larger as the coefficient becomes larger. Therefore, the hysteresis buffer 42 makes a timing of changing the output signal from the second logical value to the first logical value earlier, as the coefficient becomes larger. In this way, depending on the magnitude of the stored coefficient, the adjusting unit 44 is capable of adjusting the timing of changing the output signal to be output from the hysteresis buffer 42.

The mode switching unit 46 acquires a spike signal indicating a timing at which a spike is generated from the spike generating unit 24. The mode switching unit 46 operates the hysteresis buffer 42 in the normal mode during a period in which a spike is not generated. Also, the mode switching unit 46 operates the hysteresis buffer 42 in the spike mode during a period in which a spike is generated. In this way, regardless of the coefficient stored in the adjusting unit 44, the mode switching unit 46 is capable of changing a logic value of the output signal at an earlier timing during a period in which a spike is generated.

Figure 3:
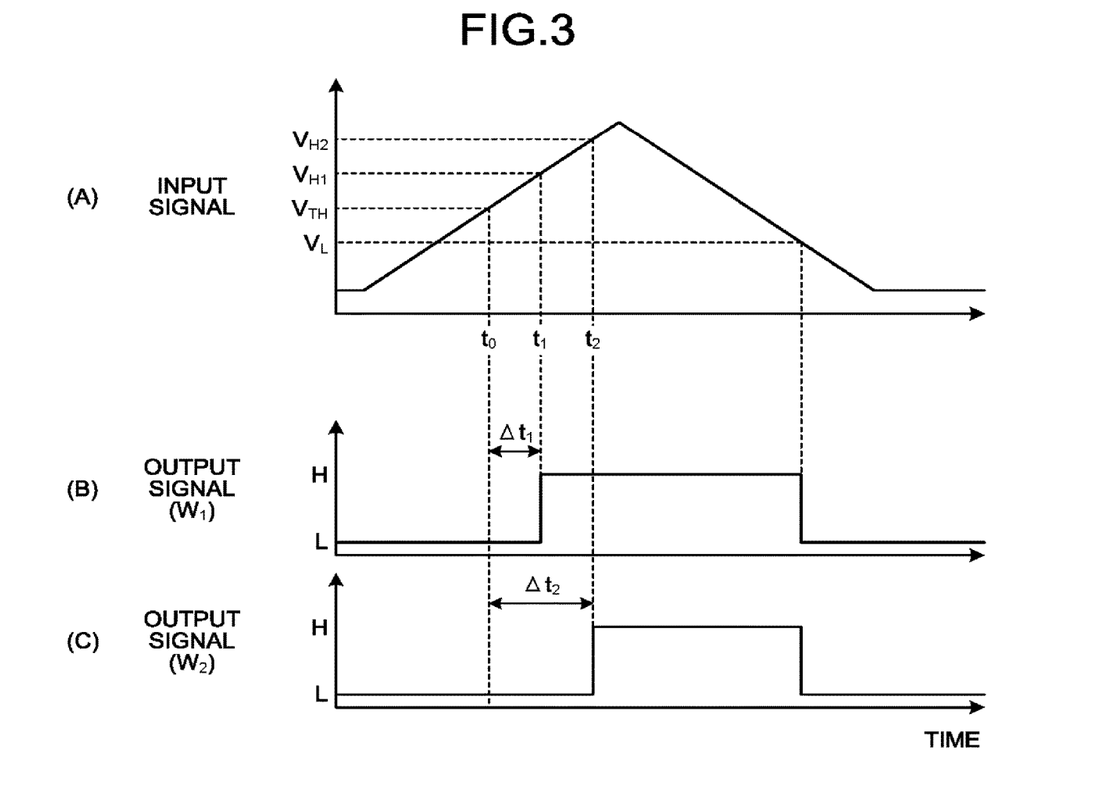
FIG. 3 is an input-output characteristic diagram of the synapse circuit in a case where a spike is not generated.

FIG. 3 is a diagram illustrating an input-output characteristic of the synapse circuit 20 in the case where a spike is not generated. (A) of FIG. 3 illustrates a waveform of an input signal that increases and decreases. (B) of FIG. 3 illustrates a waveform of an output signal in a case where a $W_1$ is set as the coefficient. (C) of FIG. 3 illustrates a waveform of an output signal in a case where a $W_2$ is set as the coefficient.

In a case where the $W_1$ is stored as the coefficient, the adjusting unit 44 adjusts the first threshold level to a $V_{H1}$. Also, in a case where a $W_2$ is stored as the coefficient, the adjusting unit 44 adjusts the first threshold level to a $V_{H2}$. In this example, the $W_1$ is larger than the $W_2$. Also, the $V_{H2}$ is larger than the $V_{H1}$. Also, the VT is the reference level. The $V_{TH}$ is smaller than the $V_{H1}$.

For example, as illustrated in (A) of FIG. 3, it is considered that the input signal linearly increases and the input signal reaches the $V_{TH}$ at time $t_0$. Further, thereafter, it is considered that the input signal reaches the $V_{H1}$ at time $t_1$ and reaches the $V_{H2}$ at time $t_2$.

In a case where a spike is not generated and the input signal increases, the hysteresis buffer 42 in which the $W_1$ is set as the coefficient changes the output signal from the first logical value (for example, the logical L) to the second logical value (for example, the logical H) at time $t_1$, as illustrated in (B) of FIG. 3. A delay time from time to to time $t_1$ is $\Delta t_1$.

Also, in the case where a spike is not generated and the input signal increases, the hysteresis buffer 42 in which the $W_2$ is set as the coefficient changes the output signal from the first logical value to the second logical value at time $t_2$, as illustrated in (C) of FIG. 3. A delay time from time $t_0$ to time $t_2$ is $\Delta t_2$.

Here, $\Delta t_2$ is longer than $\Delta t_1$. Therefore, a timing at which the output signal is changed from the first logical value to the second logical value differs depending on the coefficient. In this way, in a case where a spike is not generated and the input signal increases, the hysteresis buffer 42 is capable of changing the timing of changing the output signal from the first logical value to the second logical value, depending on the coefficient.

Incidentally, herein, although there is illustrated an example in which the first threshold level is adjusted, the adjusting unit 44 may adjust the second threshold level, depending on the coefficient. In this way, even in the case where a spike is not generated and the input signal decreases, the hysteresis buffer 42 is capable of changing a timing of changing the output signal from the second logical value to the first logical value, depending on the coefficient.

Figure 4:
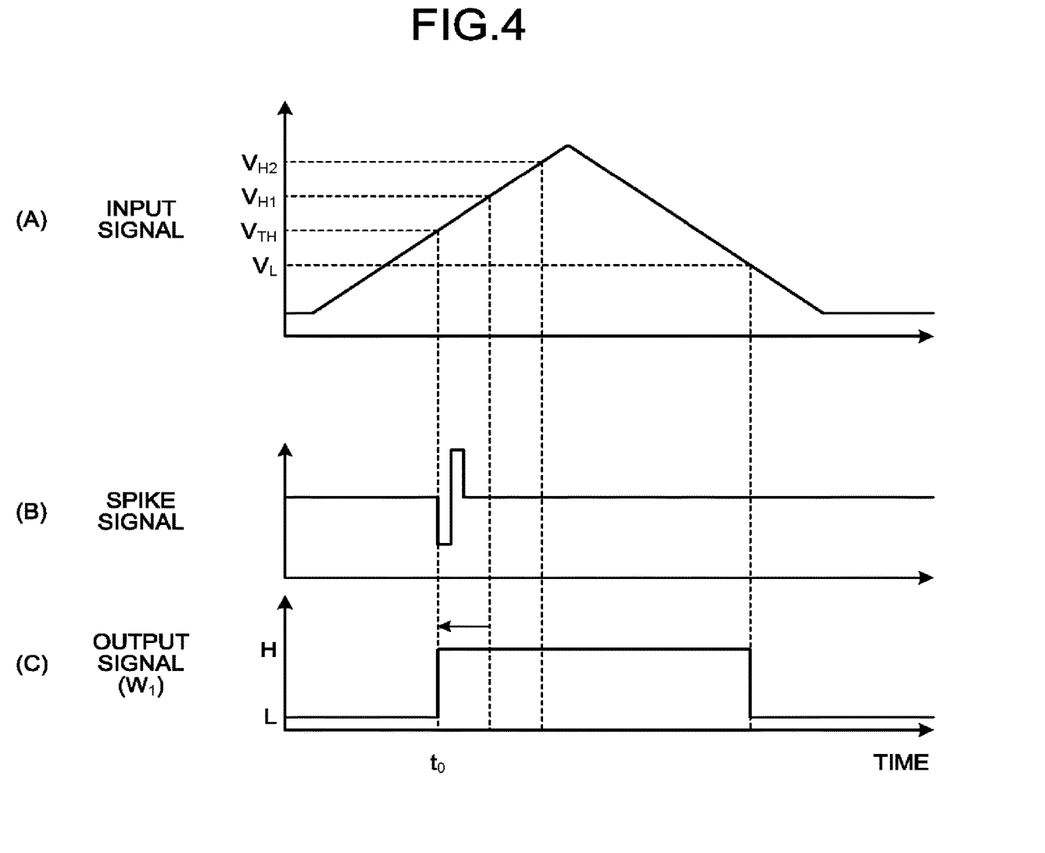
FIG. 4 is an input-output characteristic diagram of the synapse circuit in the case where a spike is generated.

FIG. 4 is a diagram illustrating an input-output characteristic of the synapse circuit 20 in a case where a spike is generated. (A) of FIG. 4 illustrates the waveform of the input signal that increases and decreases. The waveform of (A) of FIG. 4 is the same as the waveform of (A) of FIG. 3. (B) of FIG. 4 illustrates an example of the waveform of a spike signal. (C) of FIG. 4 illustrates the waveform of the output signal when the $W_1$ is set as the coefficient.

In an example of (B) of FIG. 4, a spike is generated at time to. In a case where a spike is generated and the input signal increases, regardless of the set coefficient, the hysteresis buffer 42 changes the output signal from the first logical value (for example, the logical L) to the second logical value (for example, the logical H) at time to when the input signal reaches the $V_{TH}$.

In this way, in a case where a spike is generated as the input signal increases, regardless of the set coefficient, the hysteresis buffer 42 changes the output signal from the first logical value to the second logical value when a level of the input signal becomes equal to or higher than the reference level. In this way, in a case where a spike is generated, the hysteresis buffer 42 is capable of changing the output signal from the first logical value to the second logical value earlier than a case where a spike is not generated.

Incidentally, herein, although there is illustrated a case where a spike is generated as the input signal increases, a spike signal may be generated as the input signal decreases. In a case where a spike is generated as the input signal decreases, regardless of the set coefficient, the hysteresis buffer 42 changes the output signal from the second logical value to the first logical value when the level of the input signal becomes equal to or lower than the reference level. In this way, in a case where a spike is generated, the hysteresis buffer 42 is capable of changing the output signal from the second logical value to the first logical value earlier than a case where a spike is not generated.

Figure 5:
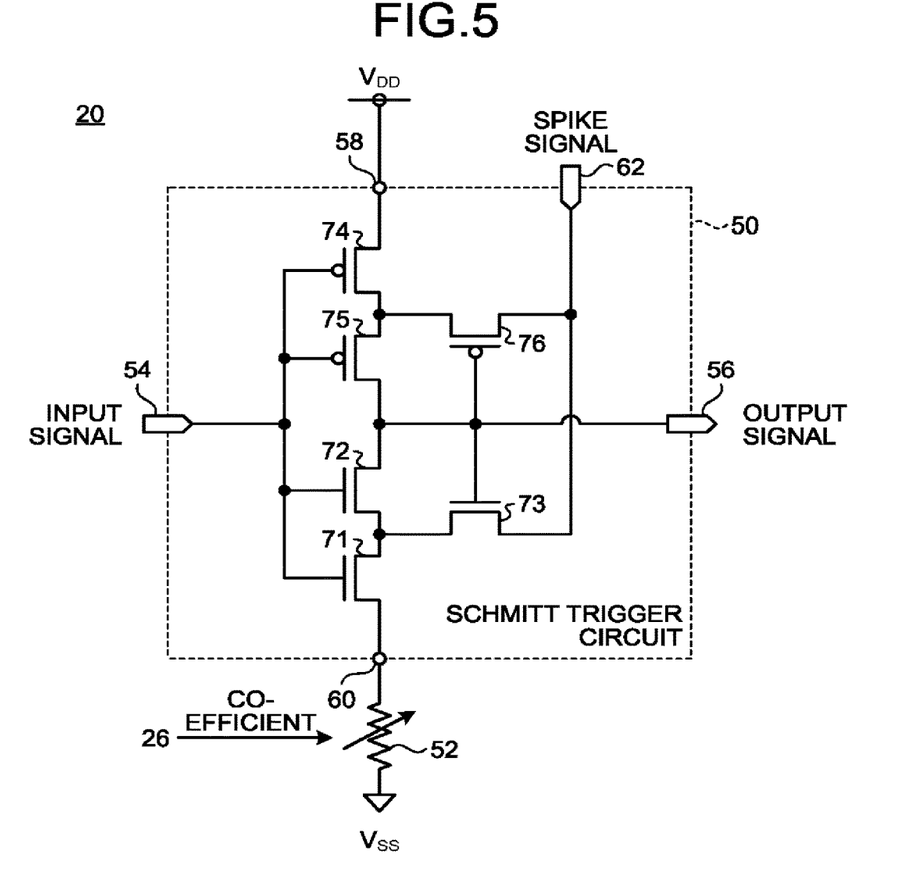
FIG. 5 is a diagram illustrating a first circuit configuration example of the synapse circuit.
Figure 6:
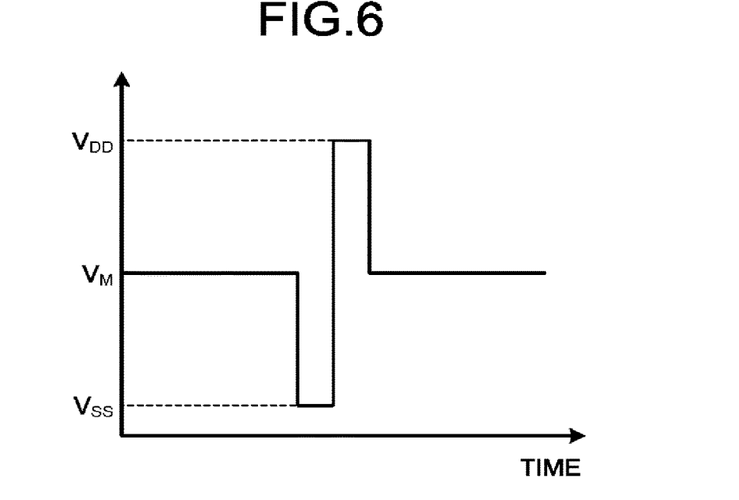
FIG. 6 is a diagram illustrating a waveform of a spike signal as a spike is generated.

FIG. 5 is a diagram illustrating a first circuit configuration example of the synapse circuit 20 using a Metal Oxide Semiconductor (MOS) type field effect transistor (FET). FIG. 6 is a diagram illustrating a waveform of a spike signal as a spike is generated.

The synapse circuit 20 includes a Schmitt trigger circuit 50 and a variable resistor 52. The Schmitt trigger circuit 50 is a circuit for implementing the hysteresis buffer 42 and the mode switching unit 46. The variable resistor 52 is configured to implement the adjusting unit 44.

The Schmitt trigger circuit 50 has an input terminal 54, an output terminal 56, a positive side power supply terminal 58, a negative side power supply terminal 60, and a spike terminal 62. An input signal is applied to the input terminal 54. The output terminal 56 outputs an output signal. A positive side power supply voltage ($V_{DD}$) is applied to the positive side power supply terminal 58. A negative side power supply voltage ($V_{SS}$) is applied to the negative side power supply terminal 60. A spike signal is applied to the spike terminal 62.

The variable resistor 52 is set to a resistance value depending on the coefficient, by the coefficient setting unit 26. The variable resistor 52 is connected between the negative side power supply terminal 60 and a voltage generation source for generating the negative side power supply voltage ($V_{SS}$). Therefore, the negative side power supply voltage ($V_{SS}$) is applied to the negative side power supply terminal 60 through the variable resistor 52.

The Schmitt trigger circuit 50 further includes a first FET 71 (a first field effect transistor), a second FET 72 (a second field effect transistor), a third FET 73 (a third field effect transistor), a fourth FET 74 (a fourth field effect transistor), a fifth FET 75 (a fifth field effect transistor), and a sixth FET 76 (a sixth field effect transistor).

The first FET 71 is an n-channel MOSFET, and is turned on when the gate-source voltage of the first FET 71 is equal to or higher than a threshold voltage. The first FET 71 has a gate connected to the input terminal 54 and a source connected to the negative side power supply terminal 60.

The second FET 72 is an n-channel MOSFET, and is turned on when the gate-source voltage of the second FET 72 is equal to or higher than the threshold voltage. The second FET 72 has a gate connected to the input terminal 54, a source connected to the drain of the first FET 71, and a drain connected to the output terminal 56.

The third FET 73 is an n-channel MOSFET, and is turned on when the gate-source voltage is equal to or higher than the threshold voltage. The third FET 73 has a gate connected to the output terminal 56 and a source connected to the source of the second FET 72.

The fourth FET 74 is a p-channel MOSFET, and is turned on when the gate-source voltage is equal to or lower than the threshold voltage. The fourth FET 74 has a gate connected to the input terminal 54 and a source connected to the positive side power supply terminal 58.

The fifth FET 75 is a p-channel MOSFET, and is turned on when the gate-source voltage of the fifth FET 75 is equal to or lower than the threshold voltage. The fifth FET 75 has a gate connected to the input terminal 54, a source connected to the drain of the fourth FET 74, and a drain connected to the output terminal 56.

The sixth FET 76 is a p-channel MOSFET, and is turned on when the gate-source voltage is equal to or lower than the threshold voltage. The sixth FET 76 has a gate connected to the output terminal 56 and a source connected to the source of the fifth FET 75.

A spike signal as illustrated in FIG. 6 is applied to the synapse circuit 20. During a period in which a spike is not generated, the spike signal illustrated in FIG. 6 is an intermediate voltage ($V_M$) between the positive side power supply voltage ($V_{DD}$) and the negative side power supply voltage ($V_{SS}$). The spike signal vertically fluctuates with the intermediate voltage ($V_M$) as a center during a period in which a spike is generated. For example, in the spike signal, a negative side pulse of the negative side power supply voltage ($V_{SS}$) is generated and a positive side pulse of the positive side power supply voltage ($V_{DD}$) is generated subsequently after the generation of the negative side pulse, during a period in which a spike is generated.

In the synapse circuit 20 according to the first circuit configuration example, during a period in which a spike is not generated, the first threshold level (a threshold level as the input signal increases) is determined by the resistance value of the variable resistor 52. In a case where a spike is not generated as the input signal increases, the synapse circuit 20 changes the output signal from an H level ($V_{DD}$ level) to an L level ($V_{SS}$ level) at a timing when the level of the input signal becomes equal to or higher than a level determined by the resistance value of the variable resistor 52. In this way, according to the synapse circuit 20 of the first circuit configuration example, it is possible to adjust a timing, at which the output signal is changed from the H level ($V_{DD}$ level) to the L level ($V_{SS}$ level) as the input signal increases, depending on the coefficient.

Also, in a case where a spike is generated, the negative side power supply voltage ($V_{SS}$) is applied to the source of the second FET 72. In this way, in a case where a spike is generated, regardless of the resistance value of the variable resistor 52, the second FET 72 is turned on when the input signal is equal to or higher than the threshold voltage. Therefore, in a case where a spike is generated as the input signal increases, the synapse circuit 20 changes the output signal from the H level ($V_{DD}$ level) to the L level ($V_{SS}$ level) at a timing when a spike is generated and the level of the input signal becomes equal to or higher than the threshold voltage.

In this way, according to the synapse circuit 20 of the first circuit configuration example, in a case where a spike is generated as the input signal increases, regardless of the set coefficient, it is possible to change the output signal from the H level to the L level when the level of the input signal becomes equal to or higher than the reference level (a threshold voltage in the FET). In this way, according to the synapse circuit 20 of the first circuit configuration example, in a case where a spike is generated, it is possible to change the output signal from the H level to the L level earlier than a case where a spike is not generated.

Figure 7:
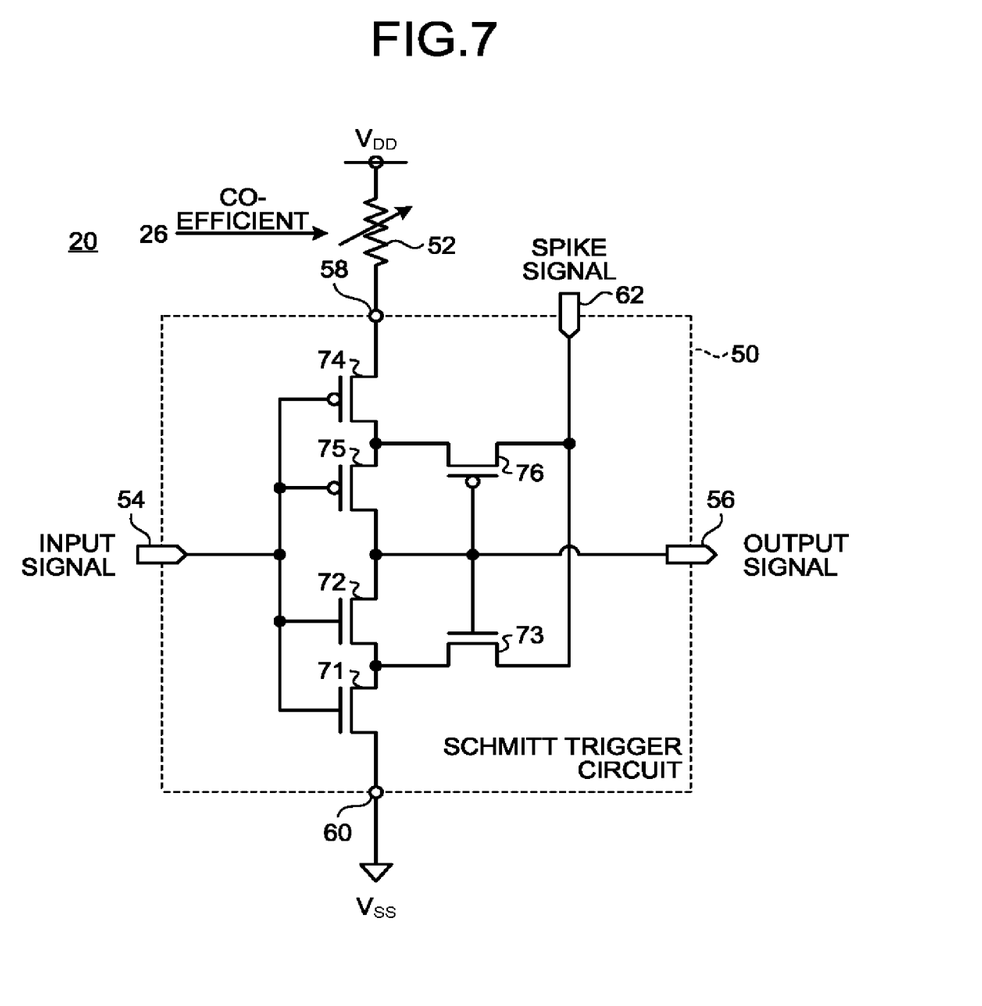
FIG. 7 is a diagram illustrating a second circuit configuration example of the synapse circuit.

FIG. 7 is a diagram illustrating a second circuit configuration example of the synapse circuit 20 using a MOS type FET. Incidentally, since the second circuit configuration example has substantially the same configuration as that of the first circuit configuration example illustrated in FIG. 5, the same components are denoted by the same reference numerals, and differences therebetween will be described.

The variable resistor 52 is connected between the positive side power supply terminal 58 and a generation source of the positive side power supply voltage ($V_{DD}$). Therefore, the positive side power supply voltage ($V_{DD}$) is applied to the positive side power supply terminal 58 through the variable resistor 52. Also, the negative side power supply terminal 60 is directly connected to the voltage generation source.

In the synapse circuit 20 according to the second circuit configuration example, during a period in which a spike is not generated, the second threshold level (a threshold level as the input signal decreases) is determined by the resistance value of the variable resistor 52. In a case where a spike is not generated as the input signal decreases, the synapse circuit 20 changes the output signal from the L level ($V_{SS}$ level) to the H level ($V_{DD}$ level) at a timing when the level of the input signal becomes equal to or lower than a level determined by the resistance value of the variable resistor 52. In this way, according to the synapse circuit 20 of the second circuit configuration example, it is possible to adjust a timing, at which the output signal is changed from the L level ($V_{SS}$ level) to the H level ($V_{DD}$ level) as the input signal decreases, depending on the coefficient.

Also, in a case where a spike is generated, the positive side power supply voltage ($V_{DD}$) is applied to the source of the fifth FET 75. In this way, in a case where a spike is generated, regardless of the resistance value of the variable resistor 52, the fifth FET 75 is turned on when the input signal is equal to or lower than the threshold voltage. Therefore, in a case where a spike is generated as the input signal decreases, the synapse circuit 20 changes the output signal from the L level ($V_{SS}$ level) to the H level ($V_{DD}$ level) at a timing when the spike is generated and the level of the input signal becomes equal to or lower than the threshold voltage.

In this way, according to the synapse circuit 20 of the second circuit configuration example, in a case where a spike is generated as the input signal decreases, regardless of the set coefficient, it is possible to change the output signal from the L level to the H level when the level of the input signal becomes equal to or lower than the reference level (a threshold voltage in the FET). In this way, according to the synapse circuit 20 of the second circuit configuration example, in a case where a spike is generated, it is possible to change the output signal from the L level to the H level earlier than a case where a spike is not generated.

Figure 8:
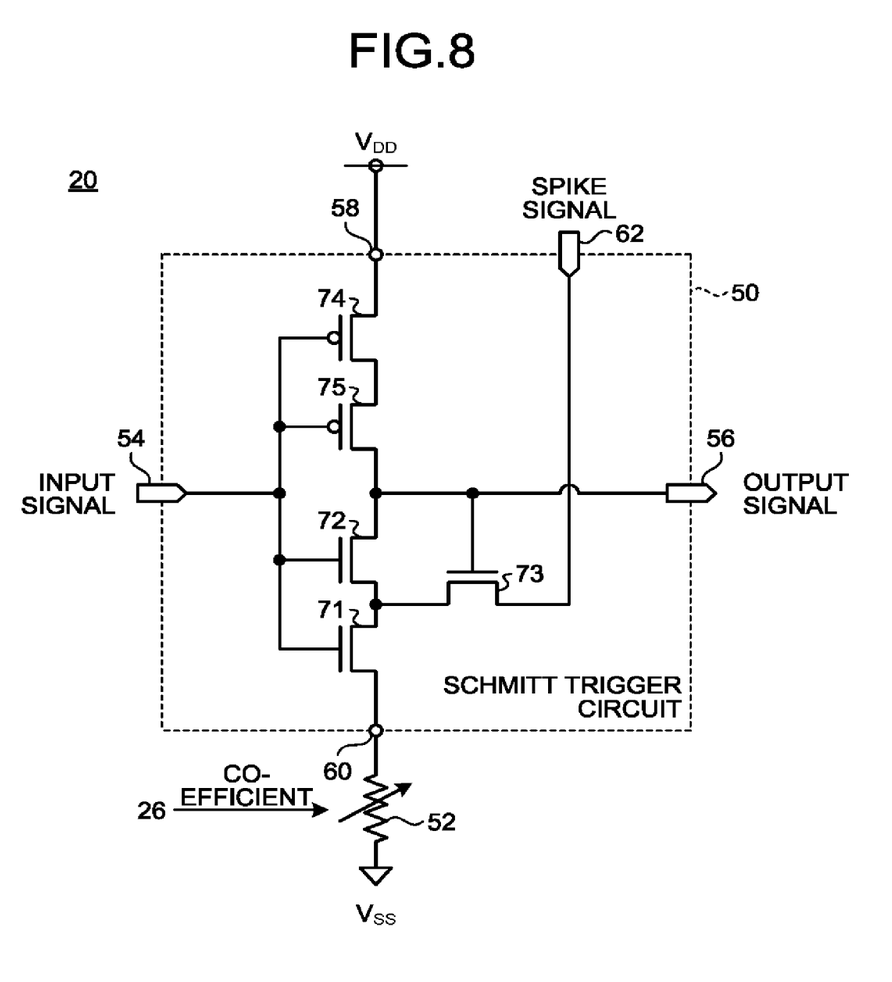
FIG. 8 is a diagram illustrating a third circuit configuration example of the synapse circuit.

FIG. 8 is a diagram illustrating a third circuit configuration example of the synapse circuit 20 using a MOS type FET. Incidentally, since the third circuit configuration example has substantially the same configuration as that of the first circuit configuration example illustrated in FIG. 5, the same components are denoted by the same reference numerals, and differences therebetween will be described.

The Schmitt trigger circuit 50 according to the third circuit configuration example does not include the sixth FET 76. In this case, the fourth FET 74 and the fifth FET 75 are turned on when the input signal becomes equal to or lower than the threshold voltage. Also, the fourth FET 74 and the fifth FET 75 are turned off when the input signal becomes larger than the threshold voltage.

Also, the Schmitt trigger circuit 50 according to the third circuit configuration example may include one switch (for example, one p-channel MOSFET) which is turned on when a voltage between the input terminal 54 and the positive side power supply terminal 58 is equal to or lower than the threshold voltage, instead of the fourth FET 74 and the fifth FET 75. In this case, the p-channel MOSFET has a gate connected to the input terminal 54, a source connected to the positive side power supply terminal 58, and a drain connected to the output terminal 56.

The synapse circuit 20 according to the third circuit configuration example also performs the same operations as those of the first circuit configuration example as the input signal increases. However, the synapse circuit 20 according to the third circuit configuration example performs no hysteresis operation as the input signal decreases, and there is also no fluctuation in the level change depending on the presence or absence of the generation of a spike. Therefore, the synapse circuit 20 according to the third circuit configuration example is capable of fixing the timing of changing the output signal from the L level ($V_{SS}$ level) to the H level ($V_{DD}$ level), regardless of the presence or absence of the generation of a spike, and the coefficient.

Figure 9:
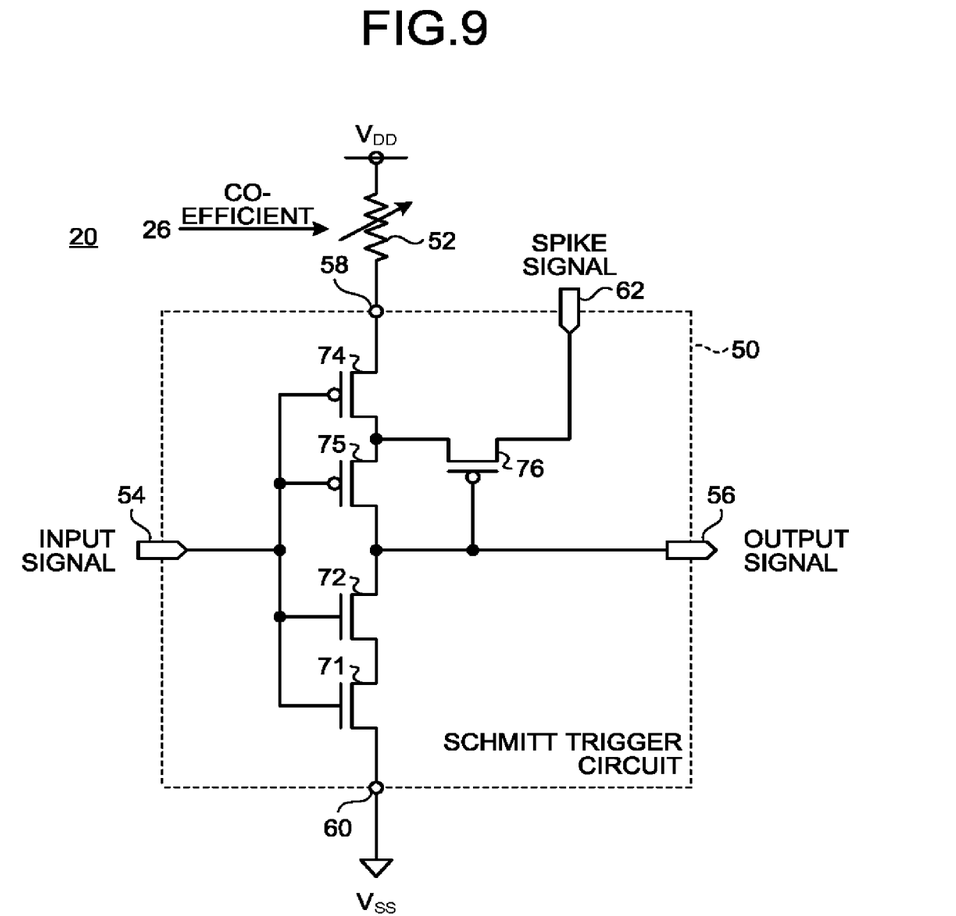
FIG. 9 is a diagram illustrating a fourth circuit configuration example of the synapse circuit.

FIG. 9 is a diagram illustrating a fourth circuit configuration example of the synapse circuit 20 using a MOS type FET. Incidentally, since the fourth circuit configuration example has substantially the same configuration as that of the second circuit configuration example illustrated in FIG. 7, the same components are denoted by the same reference numerals, and differences therebetween will be described.

The Schmitt trigger circuit 50 according to the fourth circuit configuration example does not include the third FET 73. In this case, the first FET 71 and the second FET 72 are turned on when the input signal becomes equal to or higher than the threshold voltage. Also, the first FET 71 and the second FET 72 are turned off when the input signal becomes smaller than the threshold voltage.

Also, the Schmitt trigger circuit 50 according to the fourth circuit configuration example may include one switch (for example, one n-channel MOSFET) which is turned on when a voltage between the input terminal 54 and the positive side power supply terminal 58 is equal to or higher than the threshold voltage, instead of the first FET 71 and the second FET 72. In this case, the n-channel MOSFET has a gate connected to the input terminal 54, a source connected to the negative side power supply terminal 60, and a drain connected to the output terminal 56.

The synapse circuit 20 according to the fourth circuit configuration example also performs the same operations as those of the second circuit configuration example as the input signal decreases. However, the synapse circuit 20 according to the fourth circuit configuration example performs no hysteresis operation as the input signal increases, and there is also no fluctuation in the level change depending on the presence or absence of the generation of a spike. Therefore, the synapse circuit 20 according to the fourth circuit configuration example is capable of fixing the timing of changing the output signal from H level ($V_{DD}$ level) to L level ($V_{SS}$ level), regardless of the presence or absence of the generation of a spike, and the coefficient.

Figure 10:
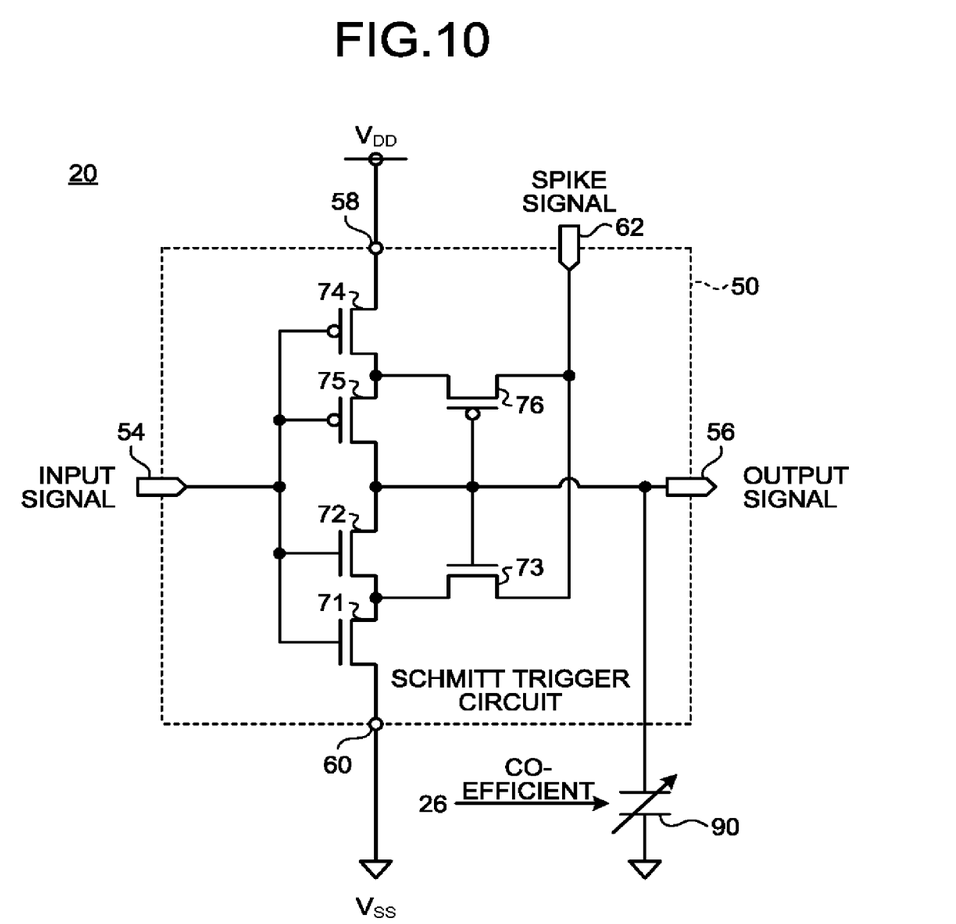
FIG. 10 is a diagram illustrating a fifth circuit configuration example of the synapse circuit.

FIG. 10 is a diagram illustrating a fifth circuit configuration example of the synapse circuit 20 using a MOS type FET. Incidentally, since the fifth circuit configuration example has substantially the same configuration as that of the first circuit configuration example illustrated in FIG. 5, the same components are denoted by the same reference numerals, and differences therebetween will be described.

The synapse circuit 20 according to the fifth circuit configuration example includes a variable capacitor 90, instead of the variable resistor 52. The variable capacitor 90 is configured to implement the adjusting unit 44.

The variable capacitor 90 is set to a capacitance depending on the coefficient, by the coefficient setting unit 26. The variable capacitor 90 is connected between the output terminal 56 and the voltage generation source for generating the negative side power supply voltage ($V_{SS}$). The variable capacitor 90 may be connected to a voltage source for generating a voltage serving as another reference, instead of a voltage generation source for generating the negative side power supply voltage ($V_{SS}$). Incidentally, the negative side power supply terminal 60 is directly connected to the voltage generation source.

In the synapse circuit 20 according to the fifth circuit configuration example, during a period in which a spike is not generated, the waveform of the output signal is delayed by the variable capacitor 90. A delayed amount of the waveform is determined by the delayed amount of the variable capacitor 90. Therefore, according to the synapse circuit 20 of the fifth circuit configuration example, it is possible to adjust the timing of changing the output signal from the H level ($V_{DD}$ level) to the L level ($V_{SS}$ level) as the input signal increases, depending on the coefficient. Also, according to the synapse circuit 20 according to the fifth circuit configuration example, the timing of changing the output signal from the L level ($V_{SS}$ level) to the H level ($V_{DD}$ level) as the input signal decreases is adjusted depending on the coefficient may do.

Incidentally, in the fifth circuit configuration example, the Schmitt trigger circuit 50 has the same configuration as that of the first circuit configuration. Therefore, in a case where a spike is generated as the input signal increases, the Schmitt trigger circuit 50 is capable of changing the output signal from the H level to the L level earlier than a case where a spike is not generated. Also, in a case where a spike is generated as the input signal decreases, the Schmitt trigger circuit 50 is capable of changing the output signal from the L level to the H level earlier than a case where a spike is not generated.

The Schmitt trigger circuit 50 may be the third circuit configuration example illustrated in FIG. 8 or the fourth circuit configuration example illustrated in FIG. 9. In the case of the third circuit configuration example, the Schmitt trigger circuit 50 is capable of fixing the timing of changing the output signal from the L level to the H level, regardless of the presence or absence of the generation of a spike, and the coefficient. Also, in the case of the fourth circuit configuration example, the Schmitt trigger circuit 50 is capable of fixing the timing of changing the output signal from the H level to the L level, regardless of the presence or absence of the generation of a spike, and the coefficient.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A synapse circuit modeling a synapse incorporating spike timing dependent synaptic plasticity (STDP) and transmitting a signal, the synapse circuit comprising:
   a buffer that changes, in a case that an output signal to be output to a subsequent-stage circuit that models a neuron in a subsequent stage of the synapse has a first logical value in a first mode, the output signal to a second logical value at a timing when an input signal, received from a preceding stage circuit that models a neuron in a preceding stage of the synapse, exceeds a first threshold level and that changes, in a case that the output signal has the first logical value in a second mode, the output signal to the second logical value at a timing when the input signal exceeds a reference level lower than the first threshold level;
   an adjusting unit that stores a coefficient indicative of a signal transmission speed in the synapse and adjusts the first threshold level depending on the coefficient; and
   a mode switching unit that acquires a spike signal indicating that a spike is generated, and that operates the buffer in the first mode during a period in which the spike is not generated, and operates the buffer in the second mode during a period in which the spike is generated, wherein the buffer includes a Schmitt trigger circuit, the Schmitt trigger circuit comprising:
an input terminal to which the input signal is applied;
an output terminal that outputs the output signal,
a positive side power supply terminal to which a positive side power supply voltage is applied; and
a negative side power supply terminal to which a negative side power supply voltage is applied,
a first field effect transistor that is turned on when a gate-source voltage is equal to or higher than a threshold voltage, the first field effect transistor having a gate connected to the input terminal and a source connected to the negative side power supply terminal,
a second field effect transistor that is turned on when a gate-source voltage is equal to or higher than a threshold voltage, the second field effect transistor having a gate connected to the input terminal, a source connected to a drain of the first field effect transistor, and a drain connected to the output terminal;
a third field effect transistor that is turned on when a gate-source voltage is equal to or higher than a threshold voltage, the third field effect transistor having a gate connected to the output terminal and a source connected to the source of the second field effect transistor;
a fourth field effect transistor that is turned on when a gate-source voltage is equal to or lower than a threshold voltage, the fourth field effect transistor having a gate connected to the input terminal and a source connected to the positive side power supply terminal;
a fifth field effect transistor that is turned on when a gate-source voltage is equal to or lower than a threshold voltage, the fifth field effect transistor having a gate connected to the input terminal, a source connected to a drain of the fourth field effect transistor, and a drain connected to the output terminal; and
a sixth field effect transistor that is turned on when a gate-source voltage is equal to or lower than a threshold voltage, the sixth field effect transistor having a gate connected to the output terminal and a source connected to the source of the fifth field effect transistor, the adjusting unit is a variable resistor set to a resistance value depending on the coefficient, and is connected between the negative side power supply terminal and a generation source of the negative side power supply voltage, and the spike signal is applied to a drain of the third field effect transistor and a drain of the sixth field effect transistor.

2. A synapse circuit according to claim 1, wherein the Schmitt trigger circuit comprises:
a switch that is turned on when a voltage between the input terminal and the positive side power supply terminal is equal to or lower than a threshold voltage.

3. A synapse circuit according to claim 1, wherein the spike signal has an intermediate voltage between the positive side power supply voltage and the negative side power supply voltage during a period in which the spike is not generated, and vertically fluctuates with the intermediate voltage as a center during a period in which the spike is generated.

4. A synapse circuit according to claim 1, wherein
the adjusting unit is a variable capacitor set to a capacitance depending on the coefficient, and is connected between the output terminal and a voltage source serving as reference.

5. A synapse circuit according to claim 1, wherein the spike signal has an intermediate voltage between the positive side power supply voltage and the negative side power supply voltage during a period in which the spike is not generated, and vertically fluctuates with the intermediate voltage as a center during a period in which the spike is generated.

6. An arithmetic device comprising:
the synapse circuit according to claim 1; and
an arithmetic circuit that is the subsequent-stage circuit and that acquires the output signal output from the synapse circuit and executes arithmetic processing based on the acquired output signal.

* * * * *